(12) United States Patent
Katayose et al.

(10) Patent No.: US 6,254,971 B1
(45) Date of Patent: Jul. 3, 2001

(54) RESIN-HAVING METAL FOIL FOR MULTILAYERED WIRING BOARD, PROCESS FOR PRODUCING THE SAME, MULTILAYERED WIRING BOARD, AND ELECTRONIC DEVICE

(75) Inventors: Teruo Katayose, Chiba; Shozo Kinoshita, Kanagawa; Takeshi Arai, Saitama, all of (JP)

(73) Assignee: Asahi Kasei Kabushiki Kaisha (JP)

( * ) Notice: Subject to any disclaimer, the term of this patent is extended or adjusted under 35 U.S.C. 154(b) by 0 days.

(21) Appl. No.: 09/202,078

(22) PCT Filed: Dec. 19, 1996

(86) PCT No.: PCT/JP96/03712

§ 371 Date: Apr. 23, 1999

§ 102(e) Date: Apr. 23, 1999

(87) PCT Pub. No.: WO97/47165

PCT Pub. Date: Dec. 11, 1997

(30) Foreign Application Priority Data

Jun. 7, 1996 (JP) .................................................. 8-145348
Jul. 9, 1996 (JP) .................................................. 8-179579

(51) Int. Cl.$^7$ ...................................................... B32B 3/00
(52) U.S. Cl. ...................... 428/209; 428/322.7; 428/323; 428/418; 428/901; 174/258
(58) Field of Search ................................... 428/209, 418, 428/901, 322.7, 323; 174/258

(56) References Cited

U.S. PATENT DOCUMENTS

| | | | |
|---|---|---|---|
| 5,112,681 | * | 5/1992 | Myojo et al. ...................... 428/474.4 |
| 5,352,745 | * | 10/1994 | Katayose et al. ..................... 428/461 |
| 5,766,740 | * | 6/1998 | Olson ................................... 428/209 |

FOREIGN PATENT DOCUMENTS

| | | |
|---|---|---|
| 61-42872 | 3/1986 | (JP) . |
| 3-165596 | 7/1991 | (JP) . |
| 3-166935 | 7/1991 | (JP) . |
| 4-91940 | 3/1992 | (JP) . |
| WO 96/40507 | 12/1996 | (WO) . |

* cited by examiner

Primary Examiner—Cathy Lam
(74) Attorney, Agent, or Firm—Pennie & Edmonds LLP

(57) ABSTRACT

The invention provides resin-having metal foil for a multilayered wiring board which comprises metal foil having provided on one side thereof a film of a thermosetting resin having a relative dielectric constant of not higher than 3.3 at a frequency range of not lower than 1 MHz and having a resin flow of from 1 to 50% or from 5 to 50%, and a process for producing the same. The invention also provides a (sequentially) multilayered wiring board produced by using the resin-having metal foil and an electronic device comprising the multilayered wiring board and an electronic element connected thereto with a wiring means.

22 Claims, 3 Drawing Sheets

RESIN-HAVING METAL FOIL FOR MULTILAYERED WIRING BOARD, PROCESS FOR PRODUCING THE SAME, MULTILAYERED WIRING BOARD, AND ELECTRONIC DEVICE

TECHNICAL FIELD

This invention relates to metal foil having provided on one side thereof a thermosetting resin film which is for use in a multilayered wiring board, a process for producing the resin-having metal foil, a multilayered wiring board having the resin-having metal foil, and an electronic device having an electronic component electrically connected to the multilayered wiring board. The multilayered wiring board according to the present invention has practically the same distance between wiring layers irrespective of the in-plane positions of the multilayered wiring board, showing small variation in characteristic impedance. Therefore, it exhibits very excellent characteristics as a wiring board for ultrahigh-speed digital circuits. The electronic device according to the present invention has excellent stability of the characteristic impedance and, with a digital semiconductor mounted as an electronic element, allows the digital semiconductor to operate at a higher speed and, with a semiconductor having an analog portion mounted as an electronic element, can handle signals of higher frequency because crosstalks of the signals are reduced. Where a resin having a glass transition temperature of 180° C. or higher after heat curing is used, the multilayered wiring board and the electronic device according to the present invention have very high reliability. Since a thermosetting resin having a relative dielectric constant of not higher than 3.3 at a frequency range of not lower than 1 MHz before heat curing is used, the multilayered wiring board of the present invention in which such a thermosetting resin is used as cured is excellent in stability of characteristic impedance, high-speed signal transmission properties, and low crosstalk properties. The electronic device using this multilayered wiring board allows a digital semiconductor to operate at its highest speed or a semiconductor dealing with analog signals to operate at its highest frequency.

BACKGROUND ART

Copper foil with an epoxy resin is known as metal foil having a thermosetting resin film. However, when such a conventional metal foil with resin is applied to production of a multilayered wiring board (sequentially multilayered wiring board) by a so-called lamination build-up process in which sheets of metal foil with resin are sequentially laminated, it has been difficult to even the film thickness of the thermosetting resin, which functions as an electrical insulator, all over the wiring board thereby to make the characteristic impedance of the wiring fall within a given range. Further, as the thermosetting resin is not intended to be applied to high-speed circuits or high-frequency analog circuits, the dielectric characteristics and heat resistance of the thermosetting resin are insufficient for such uses. In the conventional metal foil having an epoxy resin used in the production of copper-clad laminates, the dielectric constant of the resin is 3.6 to 3.9, and the glass transition temperature of the cured resin is as low as 120 to 150° C.

In the field of electric wiring boards, it is a matter of urgency to establish a lamination build-up process that will form denser wiring than a through-hole plating process. However, there has not been a suitable resin-having metal foil for use in multilayered wiring board that can be used in high-speed digital circuits and high-frequency analog circuits. It is an object of the present invention to provide a multilayered wiring board which can be used for high-speed digital circuits and high-frequency analog circuits and an electronic device using the same, in which metal foil having provided on one side thereof a film of a thermosetting resin is used, the thermosetting resin having a specific resin flow, a specific relative dielectric constant, and a specific glass transition temperature after curing.

DISCLOSURE OF THE INVENTION

As a result of extensive investigation, the inventors of the present invention have reached discovery of resin-having metal foil. The present invention consists of the following 13 embodiments.

Firstly, the present invention provides resin-having metal foil for a sequentially multilayered wiring board, which comprises metal foil having provided on one side thereof a film of a thermosetting resin having a relative dielectric constant of not higher than 3.3 at a frequency range of not lower than 1 MHz and having a resin flow of 1 to 50%.

Secondly, the present invention provides resin-having metal foil for a sequentially multilayered wiring board which comprises metal foil having on one side thereof a film of a thermosetting resin having a relative dielectric constant of not higher than 3.3 at a frequency range of not lower than 1 MHz and having a resin flow of 5 to 50%.

Thirdly, the present invention provides the resin-having metal foil for a sequentially multilayered wiring board according to claim 1 or 2, wherein the thermosetting resin contains an inorganic filler.

Fourthly, the present invention provides the resin-having metal foil for a multilayered wiring board according to claim 1, 2 or 3, wherein the thermosetting resin has a glass transition temperature of not lower than 180° C. after it cures.

Fifthly, the present invention provides the resin-having metal foil for a sequentially multilayered wiring board according to claim 1, 2, 3 or 4, wherein the thermosetting resin is a thermosetting polyphenylene ether resin.

Sixthly, the present invention provides the resin-having metal foil for a sequentially multilayered wiring board according to claim 5, wherein the thermosetting resin is a thermosetting polyphenylene ether resin containing a styrene polymer.

Seventhly, the present invention provides a process for producing resin-having metal foil for a sequentially multilayered wiring board according to claim 5 or 6, which comprises coating metal foil with a resin varnish comprising a thermosetting polyphenylene ether resin and a solvent, and drying the coating film, wherein the drying is carried out under such a condition that the rate of evaporation of the solvent be not higher than 0.10 g/cm$^2$-min.

Eighthly, the present invention provides a process for producing resin-having metal foil for a sequentially multilayered wiring board according to claim 5 or 6, which comprises coating metal foil with a resin varnish comprising a thermosetting polyphenylene ether resin and a solvent, and drying the coating film, wherein the drying is carried out under such a condition that the rate of evaporation of the solvent be not higher than 0.10 g/cm$^2$·min until the residual solvent concentration of the coating film is reduced to 200,000 ppm.

Ninethly, the present invention provides a process for producing resin-having foil for a sequentially multilayered wiring board according to claim 5 or 6, which comprises melt-extruding a thermosetting polyphenylene ether resin under a condition that does not substantially cause the resin to decompose.

Tenthly, the present invention provides the resin-having metal foil for a sequentially multilayered wiring board according to any one of claims 1 to 6, having an easily strippable sheet for protecting the resin surface.

Eleventhly, the present invention provides a sequentially multilayered wiring board, wherein the wiring layers are formed by sequentially laminating sheets of resin-having metal foil for a sequentially multilayered wiring board according to claim 1, 2, 3, 4 or 5.

Twelfthly, the present invention provides an electronic device comprising a sequentially multilayered wiring board according to the above described 11th embodiment and an electronic element connected thereto via a wiring means.

Thirteenthly, the present invention provides the electronic device according to the above described 12th embodiment, comprising a sequentially multilayered wiring board according to the above described 11th embodiment which achieves a speed of electrical signal transmission of 16.5 cm/nsec or higher and has a heat resistance of not lower than 180° C., and an electronic element.

Fourteenthly, the present invention provides the electronic device according to claim 13, comprising a (sequentially) multilayered wiring board according to claim 11 or 12 which achieves a speed of electrical signal transmission of 16.5 cm/nsec or higher and has a heat resistance of not lower than 180° C., and an electronic element.

THE BEST MODE FOR CARRYING OUT THE INVENTION

The present invention will be described in detail.

Any kind of metal foil can be used in the present invention. Examples of useful metal foils are copper foil, aluminum foil, tin foil and gold foil. For availability and ease of etching, copper foil and aluminum foil are preferred, with copper foil being the most preferred. While not limiting, the metal foil preferably has a thickness of 500 $\mu$m or less, particularly 200 $\mu$m or less, especially 105 $\mu$m or less, from the standpoint of ease in handling. The metal foil can have its side on which a thermosetting resin film is to be provided roughened and/or treated with a coupling agent so as to have increased adhesion to the resin. Electrodeposited and roughened copper foil produced and sold for wiring board production can be utilized as such in the production of the resin-having copper foil for a multilayered wiring board of the present invention. In the present invention, the metal foil serves chiefly as a conductor of the multilayered wiring board but may also be used for heat dissipation. The metal foil is selected depending on the purpose of use.

Figure 1:
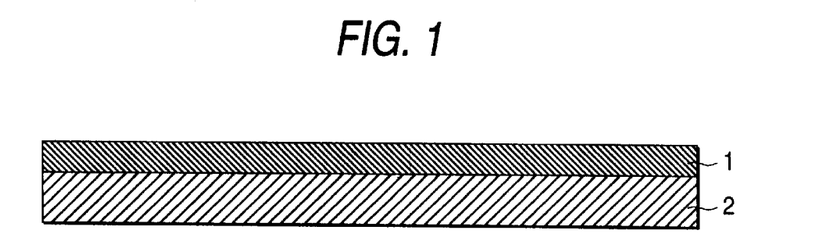
FIG. 1 is a cross section showing the structure of the thermosetting resin-having metal foil according to the present invention.

FIG. 1 is a cross section showing the structure of the thermosetting resin-having metal foil according to the present invention, wherein numerals 1 and 2 indicate metal foil and a film of a thermosetting resin, respectively.

As long as the thermosetting resin used in the present invention has a flow resin of from 1% up to 50%, remarkable effects as desired are secured. A preferred resin flow is 5 to 50%, particularly 7 to 45%. If the resin flow is less than 1%, the internal circuit is not perfectly embedded into the resin layer, making formation of a multilayered wiring board difficult. The larger the resin flow, the easier embedding of the internal circuit into the resin layer. However, if the resin flow exceeds 50%, the thickness of the insulating layer cannot be maintained even all over the wiring board, failing to keep the characteristic impedance of the wiring constant.

The resin flow is determined as follows.
(1) A 10 cm×10 cm sheet of metal foil is weighed (weight a).
(2) A 10 cm×10 cm sheet of resin-having metal foil is weighed (weight b).
(3) The resin-having metal foil is pressed at a temperature of 170° C. and a pressure of 22 kg/cm$^2$ for 10 minutes. After the part of the resin that is pressed out of the metal foil is removed, the residual resin-having metal foil is again weighed (weight b').
(4) A resin flow is obtained from equation:

$$\text{Resin flow (\%)} = [1-(b'-a)/(b-a)] \times 100$$

The thermosetting resins which can be used in the present invention include thermosetting polyphenylene ether resins, phenol resins, low-dielectric constant epoxy resins, diallyl phthalate resins, divinylbenzene resins, polyfunctional acryloyl resins, polyfunctional methacryloyl resins, polyfunctional maleimide resins, polyfunctional cyanic ester resins, polyfunctional isocyanate resins, unsaturated polyester resins, polybutadiene resins, and crosslinking polymers of styrene-butadiene, styrene-butadiene-styrene, etc. These resins are not always used as a single compound but are used with various other substances added thereto or some modification added in order to obtain desired properties, as is of necessity in industrial technology. The thermosetting resins can be used as blended with thermoplastic resins. It is essential in the present invention that the relative dielectric constant of the thermosetting resin be not higher than 3.3 and that the resin flow of the thermosetting resin of the resin-having metal foil for a multilayered wiring board be within the range specified in claims.

Preferred of the thermosetting resins above described are thermosetting polyphenylene ether resins, thermosetting polyphenylene ether resins containing a styrene polymer, resin compositions containing polydivinylbenzene, resin compositions containing polybutadiene, and resin compositions containing a polymer and/or a copolymer of triallyl cyanurate and/or triallyl isocyanurate.

The preferred thermosetting resins will be described in more detail.

Particularly preferred resins are thermosetting polyphenylene ether resins which generally show a high glass transition temperature when cured, have a relative dielectric constant of 3.0 or lower both before and after curing, and have controllable flow characteristics. Such thermosetting polyphenylene ether resins include the composition described in JP-A-7-165846 (the term "JP-A" as used herein means an "unexamined published Japanese patent application"), the composition described in JP-A-7-166049, the composition described in Japanese Patent Publication No. 7-37567, and the composition described in Japanese Patent Publication No. 7-26013. A thermosetting polyphenylene ether resin composition containing 1 to 20 parts by weight, based on the total composition, of a styrene polymer exhibits favorable characteristics in terms of flatness and toughness of the film formed thereof.

The term "styrene polymer" as referred to above is intended to mean a homopolymer of styrene or an arbitrary thermoplastic copolymer comprising at least 80% in number of a styrene unit based on the total recurring units. It is preferred for the styrene polymer to have a weight average molecular weight of 10,000 or more.

The term "polydivinylbenzene" as used herein means a polymer obtained by homo- or copolymerizing divinylbenzene and/or a derivative thereof (divinylbenzene with its hydrogen atom(s) substituted with an arbitrary atomic group (s)) in such a manner that only one of the two unsaturated double bonds of the divinylbenzene and/or the derivative thereof is polymerized while leaving the other double bond intact. The polymer disclosed in Japanese Patent Publication No. 4-1902 can be mentioned as an example of such a polymer. The proportion of the recurring unit derived from divinylbenzene or a derivative thereof in the total recurring units is preferably 5% or more, still preferably 10% or more. A preferred weight average molecular weight of the polydivinylbenzene is 10,000 or more.

The polyfunctional cyanic ester resins used in the present invention will then be described. A polyfunctional cyanic ester forms a triazine ring through thermal trimerization of the carbon-nitrogen triple bond thereby to crosslink and cure. The polyfunctional cyanic ester is used as a polyfunctional cyanic ester resin either in the form of a monomer or after partially trimerized, i.e., in the form of a prepolymer. In the present invention, the prepolymer, which is semi-solid at room temperature, is preferred because the resin is used in the form of a film.

The polybutadiene as referred to in the present invention is known poly(1,3-butadiene). The number average molecular weight of the polybutadiene is preferably 500 to 50,000, still preferably 500 to 10,000, particularly preferably 500 to 5,000. If the number average molecular weight is less than 500, the viscosity is too low. If it exceeds 50,000, the viscosity is too high.

Polymers and/or copolymers of triallyl cyanurate and/or triallyl isocyanurate are also suitable as a thermosetting resin of the resin-having metal foil of the present invention. The polymers or copolymers are obtained by heating allyl cyanurate and/or triallyl isocyanurate in a solvent, e.g., toluene, in the presence of a polymerization initiator, e.g., an organic peroxide, to cause part of the allyl groups to polymerize. The molecular structure may be either straight or branched. The weight average molecular weight is preferably 1000 to 100,000, still preferably 2000 to 100,000.

In order to impart desired performance properties to the thermosetting resin in accordance with the use, fillers and additives can be added thereto in amounts that do not impair the essential properties of the thermosetting resin. The fillers, which may be either fibrous or particulate, include silica, alumina, titanium oxide, barium titanate, talc, mica, glass beads, glass balloons, and aramid fiber. The fillers are used effectively for such purposes as reduction of a coefficient of thermal expansion, control of a dielectric constant, and the like. Useful additives include flame retardants, antioxidants, heat stabilizers, antistatic agents, plasticizers, pigments, dyes, and coloring agents.

Addition of inorganic fillers is preferred for the marked effects obtained in heat resistance and electrical characteristics of the resin layer. Silica and glass balloons are examples of the most preferred inorganic fillers.

The thickness of the thermosetting resin film is not particularly limited but is preferably 10 $\mu$m or greater, still preferably 20 $\mu$m or greater, particularly preferably 30 $\mu$m or greater. If the film thickness is extremely small, it is difficult to effect a lamination build-up process.

The thermosetting resin film can be formed through any means. For example, a preferred method comprises coating a varnish prepared by dissolving or dispersing the resin in a solvent and drying. The solvent is chosen in accordance with the resin selected. Solventless film forming is another preferred method.

The manner for bringing the metal foil and the thermosetting resin film into intimate contact with each other is not at all restricted. The resin film can be formed directly on the metal foil, or a separately prepared film of the thermosetting resin can be brought into contact with the metal foil by, for example, hot pressing. It is also possible to form a metal film on a resin film by known means such as vacuum evaporation, sputtering or chemical plating.

Where the thermosetting resin is a thermosetting polyphenylene ether resin or a thermosetting polyphenylene ether resin containing a styrene polymer, and the resin film is prepared from a resin varnish of the thermosetting resin, the special processes according to the 7th and 8th embodiments can be applied to produce resin-having metal foil having satisfactory quality at high productivity which does not separate resin powders off the resin film and suffers no cracks on the resin film surface due to drying.

The solvent which can be used in preparing varnish of a polyphenylene ether resin includes aromatic hydrocarbons, such as benzene, toluene, and xylene; halogen solvents, such as dichloromethane, chloroform, and trichloroethylene; and THF. These solvents can be used either individually or as a mixture thereof. The varnish comprising the thermosetting polyphenylene ether resin and a solvent is applied by means of an aired coater, a blade coater, a rod coater, a knife coater, a gravure coater, a reverse coater, a cast coaster, etc. The coating film is dried by means of a hot air drier, a roll heating drier, an infrared drier, a far infrared drier, etc. In the practice, these apparatus can be used either individually or as a combination of two or more thereof.

A detailed explanation is now given for the rate of evaporation in drying the coating film after application of the resin varnish comprising the thermosetting polyphenylene ether resin and a solvent. In the practice of the present invention, the evaporation rate in drying the coating film can be controlled by, for example, adjusting the temperature and flow rate of hot air for drying. The evaporation temperature can be controlled by adding a high-boiling solvent to the varnish. Such a high-boiling solvent includes chlorobenzene, tetralin, and anisole.

In the process according to the present invention, it is essential that the evaporation rate of the solvent be not higher than 0.10 g/cm$^2$.min. A preferred evaporation rate is from 0.001 to 0.10 g/cm$^2$.min. If it exceeds 0.10 g/cm$^2$ ·min, cracks occur on the coating film by drying. If the evaporation rate in drying the coating film is lower than 0.001 g/cm$^2$-min, the productivity of the resin-having metal foil tends to fall.

Where the thermosetting resin is a thermosetting polyphenylene ether resin or a thermosetting polyphenylene ether resin containing a styrene polymer, and the resin film is formed by film forming of the resin, the special process according to the 9th embodiment of the present invention can be applied to produce resin-having metal foil having satisfactory quality at high productivity which does not separate resin powders off the resin layer or suffers no cracks on the resin surface.

The process according to the 9th embodiment is characterized by selection of a temperature for melting the thermosetting polyphenylene ether resin at which the resin undergoes no substantial decomposition.

The apparatus for melt extrusion and the temperature of melt extrusion are selected so that the thermosetting polyphenylene ether resin can be melted and extruded without undergoing substantial decomposition. The melt extrusion temperature at which the thermosetting polyphenylene ether resin can be melted and extruded without substantial decomposition is selected from the range of from 50° C. up to 300° C.

Melt extrusion can be carried out by using a single-screw or multi-screw extruder having a T die at the head, a single-screw or multi-screw extruder having a kneading zone and a T die at the head, or a like apparatus.

The manner of controlling the resin flow within a range of from 1 to 50%, preferably from 5 to 50%, still preferably from 7 to 45%, is not limited. For example, the control can be achieved through selection of the chemical structure or the composition of the resin. Also, it is an effective means for resin flow control that a thermosetting resin showing too large a flow is subjected to partial cure by a method suited to the particular resin, such as a heat treatment or a photochemical treatment.

The thermosetting resin film of the resin-having metal foil for a multilayered wiring board according to the present invention can be covered with an easily strippable protective sheet thereby to provide a material for a multilayered wiring board that is extremely easy to handle and useful in practice. A composite sheet in which a sheet of metal foil, a thermosetting resin film, and an easily strippable protective sheet are intimately laminated in this order is the 10th embodiment of the present invention. The composite sheet can be produced either by laminating a protective sheet on the resin-having metal foil by, e.g., hot pressing or by laminating metal foil on the film of the thermosetting resin previously formed on a protective sheet.

The easily strippable sheet is preferably a resin film. In particular, a film of polyethylene, polypropylene, polyethylene terephthalate, etc. is preferred for its heat resistance. The surface of the film can be treated with a release agent such as a silicone resin or a fluororesin.

The resin-having metal foil for a multilayered wiring board according to the 1st to 6th embodiments of the present invention is extremely useful in industry for the following reason. In the multilayered wiring board produced by using this, each insulating layer has practically the same thickness at every position, and the multilayered wiring board can be said to have practically the same characteristic impedance at every position and will therefore provide electronic equipment, especially electronic devices, with appreciably improved electrical characteristics. With the variation of the thickness of the insulating layer, i.e., the variation of the characteristic impedance falling within ±10%, the characteristic impedance can be regarded as constant in practical use, and such a small variation does not give adverse influences to the electrical characteristics of the multilayered wiring board and semiconductor devices. Because the relative dielectric constant of the thermosetting resin is not higher than 3.3, preferably 3.0 or lower, in a frequency region of 1 MHz or higher, the resin after curing also has a small relative dielectric constant. A small relative dielectric constant of an insulating layer makes it possible to widen the wire so that the variation in characteristic impedance is reduced even if wiring is formed with the same processing margin. Further, a crosstalk is diminished. It is not until these effects are manifested in combination that the multilayered wiring board and electronic devices according to the present invention exhibit markedly excellent electrical characteristics.

According to the 3rd to 6th embodiments of the present invention, it assures high reliability of the multilayered wiring board that the cured thermosetting resin has a glass transition temperature of not lower than 180° C. If the glass transition temperature of the thermally cured resin is lower than 180° C., there is a possibility that long-term use of the device causes migration of the conductor, which results in reduction of insulation resistance, or functional disorders of the device due to deterioration of the resin. The glass transition temperature is still preferably 200° C. or higher. The glass transition temperature is measured with Rheovibron (an apparatus for measuring dynamic viscoelasticity, manufactured by Orientec) at a rate of temperature rise of 2° C./min and a frequency of 35 Hz.

According to the 11th and 12th embodiments of the present invention, it assures excellent electrical characteristics of the multilayered wiring board and semiconductor devices that the thermally cured resin has a relative dielectric constant of not more than 3.3 at a frequency range of not lower than 1 MHz. The relative dielectric constant is still preferably 3.0 or lower. If the relative dielectric constant exceeds 3.3, the delay time per unit length of the wiring becomes large to reduce the timing margin in a high-speed digital circuit, which makes it impossible to increase the clock frequency. Further, the conductor loss, which is proportional to the square root of the relative dielectric constant, increases so that the signal level margin in a high-frequency circuit is reduced to narrow the effective frequency region. Furthermore, the variation of the characteristic impedance and the crosstalk increase to give adverse influences to the circuit operation as previously stated.

Figure 2:
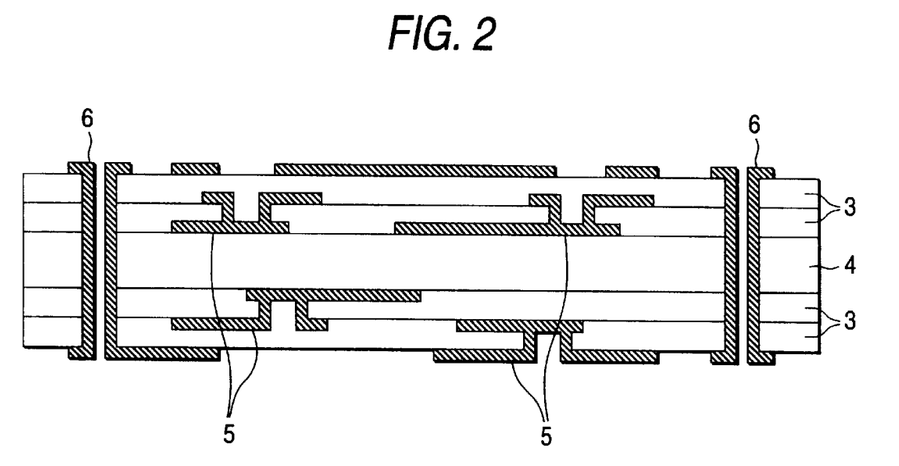
FIG. 2 is a cross section showing the sequentially multilayered wiring board according to the 11th embodiment of the present invention.

An example of the structure of the multilayered wiring board according to the 11th embodiments is shown in FIG. 2, wherein numeral 3 indicates a cured thermosetting resin film; 4: a plate made of an arbitrary electrically insulating material; 5: a via-hole; and 6: a plated through-hole.

Figure 3:
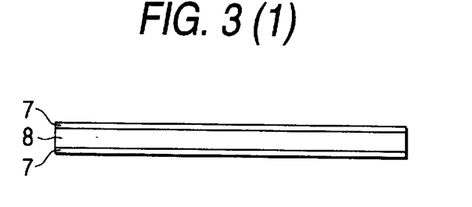
FIG. 3 is cross section showing an example of the process for producing the sequentially multilayered wiring board according to the 11th embodiment.

In FIG. 3 is shown an example of the process for producing the sequentially multilayered wiring board of the 11th embodiment. The example of the process will be explained in order.

(1) The production starts with an electrically insulating plate 8 having on both sides thereof a conductor layer 7, e.g., a double-sided copper-clad laminate.

(2) The conductor 7 is processed by a known means, such as etching, to form a circuit pattern 7'.

(3) The thermosetting resin-having metal foil according to the present invention is laminated on each side by a known means such as hot pressing. A conductor layer 9 and a thermally cured thermosetting resin layer 10 are thus formed.

(4) Via-holes 11 are made.

(5) A conductor film 12 is formed by a known method, for example, electroless plating followed by copper electro plating, to obtain via connection, and a circuit pattern is formed in the same manner as in (2).

(6) The thermosetting resin-having metal foil of the present invent ion is laminated to form another conductor layer 13 and another thermally cured thermosetting resin layer 12 in the same manner as in (3).

(7) If necessary, through-holes 15 are pierced through the whole laminate as is usual with conventional multilayered wiring board.

(8) A conductor layer 16 is formed by a known method, for example, electroless plating followed by copper electroplating, to obtain via connection and through-hole connection, and a circuit pattern is formed in the same manner as in (5).

While FIG. 3 illustrates a 6-layered board, it is obvious that a multilayered wiring board having an arbitrary number of circuit layers can be built up by using the thermosetting resin-having metal foil of the present invention and repeating via-hole formation, via connection, and circuit formation.

Figure 4:
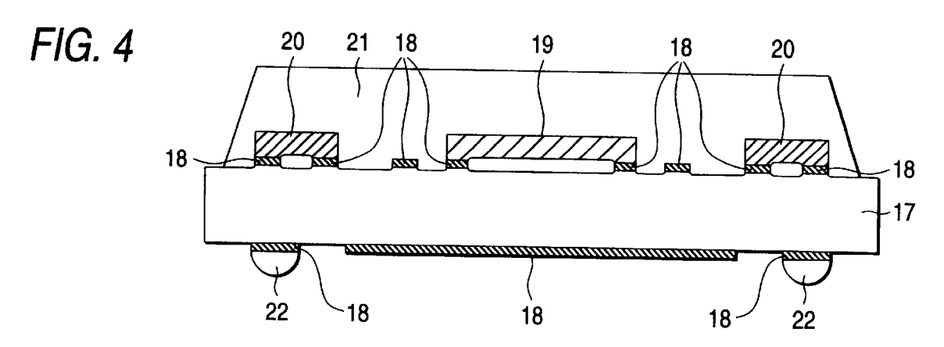
FIGS. 4 through 6 are each a cross section of an example of the electronic device according to the 12th embodiment of the present invention.
Figure 5:
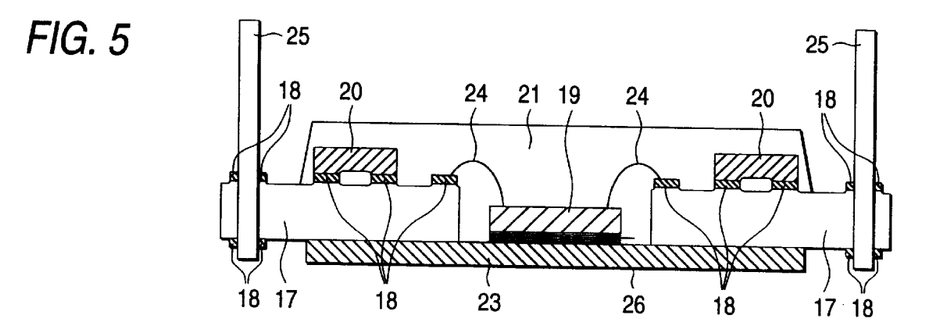
Figure 6:
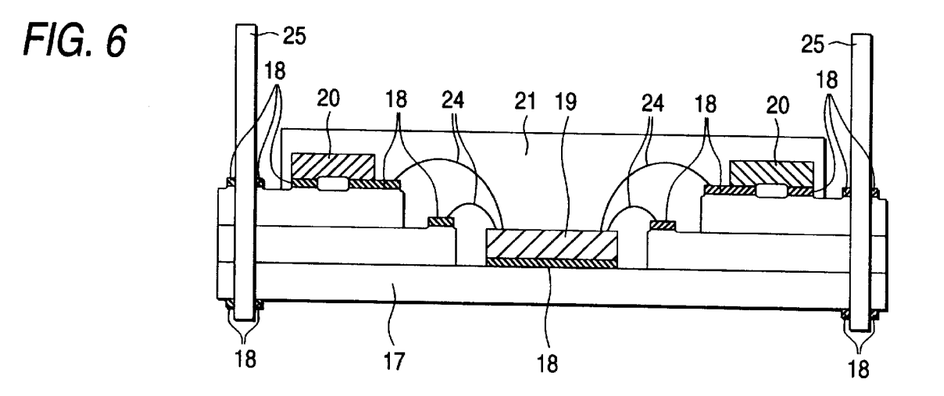

Examples of the electronic device according to the 12th embodiment of the present invention are shown in FIGS. 4 through 6. The 12th embodiment is characterized in that the multilayered wiring board of the present invention is used in an electronic device of arbitrary structure to make the electronic device manifest excellent electrical characteristics. The wiring means for connecting the electronic element and the multilayered wiring board is selected appropriately depending on the structure from among, for example, wire bonding and flip chip bonding.

In FIGS. 4 to 6, numeral 17 indicates a multilayered wiring board of the present invention; 18: a conductor; 19: a semiconductor chip; 20: an individual electronic element such as a dielectric, a capacitor, an inductor, and/or a resistor; 21: a sealing means; 22: a solder ball; 23: a heat dissipating plate; 24: bonding wire; 25: a metallic pin; and 26: a silicon chip bonding means.

Of the electronic devices of the 12th embodiment, one which is designed to achieve a rate of electrical signal transmission of 16.5 cm/nsec or higher at every position and in which the multilayered wiring board has a heat resistance of not lower than 180° C. as a whole corresponds to the 13th embodiment of the present invention.

While electronic devices include various structures, relevant to the present invention are those essentially comprising electronic elements, such as a semiconductor chip cut out of a semiconductor wafer or ingot of silicon, gallium-arsenic, etc. (or a semiconductor in the form easier to handle, for example, mounted on a carrier), a dielectric, a capacitor, an inductor and/or a resistor, and a multilayered wiring board on which these electronic elements are mounted. Where in using the electronic device in which signals are transmitted through the wiring formed inside and outside the multilayered wiring board at a speed of 16.5 cm/nsec or higher, not only is shortened the delay time attributed to the electronic device, but also the disturbance of the wave form at the rise and the drop of digital signals, which is problematical in dealing with high-speed signals, is lessened, thereby providing an extremely excellent electronic device. This is one of the significant effects of the present invention. In a practical multilayered wiring board, since electric signals are transmitted by the vibrations of the electric field between a signal wire and the corresponding ground potential surface, the positional relationship between the signal wire and the ground potential conductor and the dielectric characteristics of the insulating material occupying the space therebetween should be taken into consideration in designing. To the contrary, the positional relationship between the ground potential conductor and the power potential conductor and the dielectric characteristics of the insulating material existing therebetween are not important.

Another effect is produced from the heat resistance of the multilayered wiring board being 180° C. or higher. Electronic devices are required to exhibit extremely stable operating characteristics in a high-speed digital circuit or a high-speed digital/analog mixed circuit. By setting the heat resistance temperature of the multilayered wiring board at 180° C. or higher, the electronic device of the present invention shows little variation of characteristics with changes in temperature and humidity. The above-described two remarkable effects are combined to make the electronic device of the 13th embodiment truly useful as a component of a high- speed digital circuit and a high-speed digital/analog mixed circuit.

The terminology "heat resistance (temperature)" as used in the 13th embodiment means the temperature closest to room temperature of several temperatures above room temperature at which a substance undergoes some noticeable change, such as thermal decomposition initiation temperature and a phase transition point. The multilayered wiring board of the present invention in actual use is of necessity a composite of various materials. Of the respective heat resistance temperatures of the materials, the temperature which is the closest to room temperature is taken as a heat resistance of the multilayered wiring board. In practice, it is needless to say that a composite which is made up of a mixture of a resin, ceramics, etc. and functions as a single material is handled as a single component.

In the production of the sequentially multilayered wiring board, the wiring layers sequentially built up can be electrically connected to each other by conventional through-hole plating, but it is preferred for enabling high-density wiring to conduct electrical connection by making via-holes for each wiring layer. A single multilayered wiring board may have both through-holes and via-holes. Boring and electrical connection between layers can be carried out by any arbitrary method. While not intended to limit, an example of the procedure for forming via-holes is described below. Holes are bored into the surface metal foil by, for example, etching to expose the thermosetting resin layer, and the exposed resin portion is removed by laser beam machining with an excimer laser, a carbonic acid gas laser, an YAG laser, etc., dry etching (such as ion beam etching or plasma etching), or wet etching with a corrosive chemical to expose the lower metal foil. The upper and lower metal layers are then connected by depositing a metal film on the resin inner wall of the holes by plating, sputtering or a like technique or filling the holes with a conductive paste. Boring through the metal foil and through the resin layer may be carried out separately as described above or simultaneously by boring a hole with a drill to a depth that does not pierce the lower metal foil.

While the multilayered wiring board according to the present invention is produced by a lamination build-up process, some of the constituent layers may be provided by other processes, for example, laser beam machining of a photosensitive insulating resin or a thermosetting resin and conductor formation by an electroless thick plating technology.

The electronic devices according to the present invention include those in which an electronic element is mounted on the multilayered wiring board of the present invention and those in which an electronic element is mounted on a separate plate, such as a metallic plate or a ceramic plate which also serves as a heat dissipation plate, and the multilayered wiring board of the present invention is designed to have cavities surrounding the electronic element and is bonded onto the plate. Since the multilayered wiring board of the present invention is prepared by a lamination build-up process, multilevel wiring can be formed on an arbitrary plate. The plate itself may be such that has a heat dissipation function, a wiring function or a function for realizing special electrical characteristics, for example, a metal plate, a metal-core wiring plate, a ceramic plate, a ceramic multilayered wiring board, etc.

The present invention will now be made clearer by way of Examples, but the Examples are not intended to limit the scope of the present invention.

EXAMPLE 1

A sheet of resin-having copper foil for a multilayered wiring board was prepared by using, as a thermosetting resin, a thermosetting polyphenylene ether resin having a relative dielectric constant of 2.7 at 1 MHz and, as metal foil, 12 μm-thick electrodeposited copper foil for a printed wiring board. The thickness of the resin film was 60 μm. The resin flow was 3%. When the thermosetting polyphenylene ether resin was heat cured, the glass transition temperature and the relative dielectric constant of the cured resin were found to be 220° C. and 2.8 (at a frequency of 1 MHz), respectively. A 0.3 mm-thick double-sided copper-clad thermosetting polyphenylene ether laminate having 18 μm-thick copper foil on each side thereof was processed to form an internal circuit on each side thereof, and the above-described thermosetting polyphenylene ether resin-having copper foil was laminated on each side. The copper foil on each side was processed to form an outer circuit to obtain a 4-layered wiring board having a size of 330 mm×400 mm. On measurement, the characteristic impedance of the wiring of the 4-layered wiring board was revealed to be stable all over the area, only showing variation within ±10%. Part of the 4-layered wiring board was embedded in an epoxy resin, and the cut area was polished and observed under an optical microscope. It was found that the internal circuit was completely embedded in the thermosetting polyphenylene ether resin with no voids.

EXAMPLE 2

A sheet of resin-having copper foil for a multilayered wiring board was prepared by using, as a thermosetting resin, a thermosetting polyphenylene ether resin having a relative dielectric constant of 2.8 at 1 MHz and, as metal foil, 12 μm-thick electrodeposited copper foil for a printed wiring board. The thickness of the resin film was 60 μm. The resin flow was 39%. When the thermosetting polyphenylene ether resin was heat cured, the glass transition temperature and the relative dielectric constant of the cured resin were found to be 210° C. and 2.9 (at a frequency of 1 MHz), respectively. A 0.3 mm-thick double-sided copper-clad thermosetting polyphenylene ether laminate having 18 μm-thick copper foil on each side thereof was processed to form an internal circuit on each side thereof, and the above-described thermosetting polyphenylene ether resin-having metal foil was laminated on each side. The copper foil on each side was processed to form an outer circuit to obtain a 4-layered wiring board having a size of 330 mm×400 mm. On measurement, the characteristic impedance of the wiring of the 4-layered wiring board was revealed to be stable all over the area, only showing variation within ±10%. Separately, a 4-layered wiring board having a size of 35 mm×35 mm was prepared by using the same resin-having copper foil for a multilayered wiring board and the same double-sided copper-clad laminate, and a digital semiconductor was mounted thereon to make a semiconductor device. The semiconductor device was mounted on a test circuit having a variable clock generator, and the working range of clock frequency was measured. As a result, the device operated up to 100 MHz. The semiconductor device was treated in a pressure cooker at 121° C. under 2 atm., and the behavior at 100 MHz was observed. No influence on the behavior was observed until the treating time reached 3000 hours. When the semiconductor device was subjected to a thermal shock test between −65° C. and 125° C., no influence on the behavior was displayed up to 1000 cycles.

EXAMPLE 3

Four parts by weight of polystyrene having a weight average molecular weight of 500,000 were added to 100 parts by weight of the thermosetting polyphenylene ether resin of Example 2. The resulting thermosetting polyphenylene ether resin containing polystyrene had a relative dielectric constant of 2.8 at 1 MHz. A sheet of resin-having copper foil for a multilayered wiring board was prepared by using the thermosetting polyphenylene ether resin containing polystyrene and 12 μm-thick electrodeposited copper foil for a printed wiring board. A 60 μm-thick resin film having a smooth and glossy surface was formed easily. The resin flow was 40%. When the thermosetting polyphenylene ether resin was heat cured, the glass transition temperature and the relative dielectric constant of the cured resin were found to be 210° C. and 2.9 (at a frequency of 1 MHz), respectively. A 0.3 mm-thick double-sided copper-clad thermosetting polyphenylene ether laminate having 18 μm-thick copper foil on each side thereof was processed to form an internal circuit on each side thereof, and the above-described thermosetting polyphenylene ether resin-having metal foil was laminated on each side. The copper foil on each side was processed to form an outer circuit to obtain a 4-layered wiring board having a size of 330 mm×400 mm. On measurement, the characteristic impedance of the wiring of the 4-layered wiring board was revealed to be stable all over the area, only showing variation within ±10%. Separately, a 4-layered wiring board for a semiconductor device having a size of 35 mm×35 mm was prepared by using the same resin-having copper foil for a multilayered wiring board and the same double-sided copper-clad laminate, and a digital semiconductor was mounted thereon to make a semiconductor device. The semiconductor device was mounted on a test circuit having a variable clock generator, and the working range of clock frequency was measured. As a result, the device worked up to 100 MHz. The semiconductor device was treated in a pressure cooker at 121° C. under 2 atm., and the behavior at 100 MHz was observed. No influence on the behavior was observed until the treating time reached 3000 hours. When the semiconductor device was subjected to a thermal shock test between -65° C. and 125° C., no influence on the behavior was displayed up to 1000 cycles.

EXAMPLE 4

Ninety parts by weight of poly(paradivinylbenzene) having a molecular weight of 50,000 and 10 parts by weight of a bismaleimide compound having formula 1 shown below were mixed to prepare a thermosetting resin. The dielectric constant of the resulting thermosetting resin at 1 MHz was 2.7.

Formula 1

A sheet of resin-having copper foil for a multilayered wiring board was prepared by using the thermosetting resin containing polydivinylbenzene and 12 μm-thick electrodeposited copper foil for a printed wiring board. The thickness of the resin film was 60 μm. The resin flow was 15%. When the thermosetting polydivinylbenzene resin was heat cured, the glass transition temperature and the relative dielectric constant of the cured resin were found to be 460° C. and 2.8 (at a frequency of 1 MHz), respectively. A 0.3 mm-thick double-sided copper-clad thermosetting polyphenylene ether laminate having 18 μm-thick copper foil on each side thereof was processed to form an internal circuit on each side thereof, and the above-described polydivinylbenzene resin-having metal foil was laminated on each side. The copper foil on each side was processed to form an outer circuit to obtain a 4-layered wiring board having a size of 330 mm×400 mm. On measurement, the characteristic impedance of the wiring of the 4-layered wiring board was revealed to be stable all over the area, only showing variation within ±10%. Separately, a 4-layered wiring board for a semiconductor device having a size of 35 mm×35 mm was prepared by using the same resin-having copper foil for a multilayered wiring board and the same double-sided copper-clad laminate, and a digital semiconductor was mounted thereon to make a semiconductor device. The semiconductor device was mounted on a test circuit having a variable clock generator, and the working range of clock frequency was measured. As a result, the device operated up to 100 MHz. The semiconductor device was treated in a pressure cooker at 121° C. under 2 atm., and the behavior at 100 MHz was observed. No influence on the behavior was observed until the treating time reached 3000 hours. When the semiconductor device was subjected to a thermal shock test between −65° C. and 125° C., no influence on the behavior was observed up to 1000 cycles.

EXAMPLE 5

A bifunctional cyanic ester having formula 2 shown below was polymerized partially to prepare a prepolymer having a number average molecular weight of 560 and a weight average molecular weight of 1310. A hundred parts by weight of the prepolymer, 1 part by weight of nonylphenol, and 0.25 part by weight of cobalt octate were mixed to prepare a polyfunctional cyanic ester resin. The dielectric constant of the resulting thermosetting resin at 1 MHz was found to be 2.9.

Formula 2

A sheet of resin-having copper foil for a multilayered wiring board was prepared by using the polyfunctional cyanic ester resin and 12 μm-thick electrodeposited copper foil for a printed wiring board. The thickness of the resin film was 60 μm. The resin flow was 41%. When the polyfunctional cyanic ester resin was heat cured, the glass transition temperature and the relative dielectric constant of the cured resin were found to be 280° C. and 3.0 (at a frequency of 1 MHz), respectively. A 0.3 mm-thick double-sided copper-clad thermosetting polyphenylene ether laminate having 18 μm-thick copper foil on each side thereof was processed to form an internal circuit on each side thereof, and the above-described polyfunctional cyanic ester resin-having metal foil was laminated on each side. The copper foil on each side was processed to form an outer circuit to obtain a 4-layered wiring board having a size of 330 mm×400 mm. On measurement, the characteristic impedance of the wiring of the 4-layered wiring board was revealed to be stable all over the area, only showing variation within ±10%. Separately, a 4-layered wiring board for a semiconductor device having a size of 35 mm×35 mm was prepared by using the same resin-having copper foil for a multilayered wiring board and the same double-sided copper-clad laminate, and a digital semiconductor was mounted thereon to make a semiconductor device. The semiconductor device was mounted on a test circuit having a variable clock generator, and the working range of clock frequency was measured. As a result, the device operated up to 100 MHz. The semiconductor device was treated in a pressure cooker at 121° C. under 2 atm., and the behavior at 100 MHz was observed. No influence on the behavior was observed until the treating time reached 3000 hours. When the semiconductor device was subjected to a thermal shock test between −65° C. and 125° C., no influence on the behavior was observed up to 1000 cycles.

EXAMPLE 6

A hundred parts by weight of polybutadiene having a number average molecular weight of 3,100 and 2 parts by weight of dicumyl peroxide were mixed to prepare a thermosetting resin. The dielectric constant of the resulting thermosetting resin at 1 MHz was 2.4.

A sheet of resin-having copper foil for a multilayered wiring board was prepared by using the polybutadiene-based thermosetting resin and 12 μm-thick electrodeposited copper foil for a printed wiring board. The thickness of the resin film was 60 μm. The resin flow was 43%. When the polybutadiene-based thermosetting resin was heat cured, the glass transition temperature and the relative dielectric constant of the cured resin were found to be 150° C. and 2.5 (at a frequency of 1 MHz), respectively. A 0.3 mm-thick double-sided copper-clad thermosetting polyphenylene ether laminate having 18 μm-thick copper foil on each side thereof was processed to form an internal circuit on each side thereof, and the above-described metal foil having the polybutadiene-based thermosetting resin film was laminated on each side. The copper foil on each side was processed to form an outer circuit to obtain a 4-layered wiring board having a size of 330 mm×400 mm. On measurement, the characteristic impedance of the wiring of the 4-layered wiring board was revealed to be stable all over the area, only showing variation within ±10%. Separately, a 4-layered wiring board for a semiconductor device having a size of 35 mm×35 mm was prepared by using the same resin-having copper foil for a multilayered wiring board and the same double-sided copper-clad laminate, and a digital semiconductor was mounted thereon to make a semiconductor device. The semiconductor device was mounted on a test circuit having a variable clock generator, and the working range of clock frequency was measured. As a result, the device operated up to 100 MHz.

EXAMPLE 7

Triallyl isocyanurate was heated in toluene together with a peroxide to obtain poly(triallyl isocyanurate) having a weight average molecular weight of 3,000. Ninety parts by weight of the poly(triallyl isocyanurate), 10 parts by weight of triallyl isocyanaurate (monomer), and 3 parts by weight of 2,5-dimethyl-2,5-di(t-butylperoxy)hexyn-3 were mixed to prepare a thermosetting poly(triallyl isocyanurate) resin. The dielectric constant of the resulting thermosetting resin at 1 MHz was 3.1.

A sheet of resin-having copper foil for a multilayered wiring board was prepared by using the thermosetting resin containing poly(triallyl isocyanurate) and 12 $\mu$m-thick electrodeposited copper foil for a printed wiring board. The thickness of the resin film was 60 $\mu$m. The resin flow was 25%. When the thermosetting poly(triallyl isocyanurate) resin was heat cured, the glass transition temperature and the relative dielectric constant of the cured resin were found to be 350° C. and 3.3 (at a frequency of 1 MHz), respectively. A 0.3 mm-thick double-sided copper-clad thermosetting polyphenylene ether laminate having 18 $\mu$m-thick copper foil on each side thereof was processed to form an internal circuit on each side thereof, and the above-described metal poly(triallyl isocyanurate) resin-having metal foil was laminated on each side. The copper foil on each side was processed to form an outer circuit to obtain a 4-layered wiring board having a size of 330 mm×400 mm. On measurement, the characteristic impedance of the wiring of the 4-layered wiring board was revealed to be stable all over the area, only showing variation within ±10%. Separately, a 4-layered wiring board for a semiconductor device having a size of 35 mm×35 mm was prepared by using the same resin-carrying copper foil for a multilayered wiring board and the same double-sided copper-clad laminate, and a digital semiconductor was mounted thereon to make a semiconductor device. The semiconductor device was mounted on a test circuit having a variable clock generator, and the working range of clock frequency was measured. As a result, the device worked up to 100 MHz. The semiconductor device was treated in a pressure cooker at 121° C. under 2 atm., and the behavior at 100 MHz was observed. No influence on the behavior appeared until the treating time reached 3000 hours. When the semiconductor device was subjected to a thermal shock test between −65° C. and 125° C., no influence on the behavior was displayed up to 1000 cycles.

COMPARATIVE EXAMPLE 1

A sheet of resin-having copper foil was prepared in the same manner as in Example 2 except for replacing the thermosetting polyphenylene ether resin with an epoxy resin for a copper-clad laminate. The resin flow was 65%. When the epoxy resin was heat cured, the glass transition temperature and the relative dielectric constant of the cured resin were found to be 150° C. and 3.8 (at a frequency of 1 MHz), respectively. A 4-layered wiring board was prepared in the same manner as in Example 1, and the characteristic impedance was measured. The characteristic impedance showed variation of ±16%. A semiconductor device having mounted thereon a digital semiconductor was prepared. The clock frequency at which the semiconductor device could operate was 80 MHz. When treated in a pressure cooker at 121° C. under 2 atm., the semiconductor device came to a failure of operation at 80 MHz in 1000 hours. Further, when subjected to a thermal shock test between −65° C. and 125° C., the device came to a failure of operation at the 300th cycle.

EXAMPLES 8 TO 10

A resin varnish prepared from the thermosetting polyphenylene ether resin of Example 2 and toluene as a solvent was applied to a side of 12 $\mu$m-thick electrodeposited copper foil for printed wiring board and dried to form a resin film having a thickness of 50 $\mu$m. The drying was carried out by means of a hot air drier while controlling the temperature and flow rate of hot air so that the solvent might evaporate at a rate of 0.005 g/cm$^2$·min (Example 8), 0.01 g/cm$^2$·min (Example 9) or 0.05 g/cm$^2$·min (Example 10) until the residual solvent concentration of the coating film was decreased to 200,000 ppm. The resulting resin-having sheet had no cracks by drying on the coated surface. No fall-off of resin particles occurred in machining (e.g., cutting) the resin-having foil or handling in the production of a multi-layered wiring board by sequentially lamination, and a multilayered wiring board having high reliability was produced.

COMPARATIVE EXAMPLE 2

Resin-having metal foil was prepared in the same manner as in Examples 8 to 10, except that the drying of the coating film of Example 2 was carried out while controlling the temperature and flow rate of hot air to adjust the evaporation rate of the solvent at 0.2 g/cm$^2$·cm. The resulting sheet suffered cracks due to drying on the coated surface thereof. Fall-off of resin particles was observed in machining, for example, cutting of the sheet and in handling in the production of a multilayered wiring board by sequentially lamination. The cut area of the multilayered wiring board thus obtained was observed to find insufficient embedding of the circuit in the resin layer.

EXAMPLES 11 TO 13

The thermosetting polyphenylene ether resin of Example 2 was melt extruded onto a side of 12 $\mu$m-thick electrode-posited copper foil for a printed wiring board to a dry thickness of 50 $\mu$m to form a resin film on the copper foil. A twin-screw extruder having a T die at the head was used for melt extrusion. The melt extrusion temperature was set at 80° C. (Example 11), 120° C. (Example 12) or 250° C. (Example 13). The resulting resin-having metal foil had a smooth surface. No fall-off of resin particles occurred in machining, e.g., cutting, or handling of the resin-having foil in the production of a multilayered wiring board by sequentially lamination, and a multilayered wiring board having high reliability was produced.

COMPARATIVE EXAMPLE 3

Resin-having metal foil was prepared in the same manner as in Examples 11 to 13, except that the melt-extruded film of the thermosetting polyphenylene ether resin of Example 2 was formed at a melt extrusion temperature of 350° C. The surface of the resulting resin-having metal foil was not smooth. Although there was observed no fall-off of resin particles in machining, e.g., cutting, of the resin-carrying foil or in handling of the resin-having foil in the production of a multilayered wiring board by sequentially lamination, the cut area of the multilayered wiring board thus produced showed insufficient embedding of the circuit in the resin.

EXAMPLE 14

A 10 $\mu$m-thick polyethylene film was adhered to the resin surface of the thermosetting polyphenylene ether resin-having metal foil prepared in Example 2 by means of a hot roll heated at 100° C. to provide the resin film with a protective sheet. The resin-having metal foil as protected by the protective sheet was wound around a cylinder having a diameter of 10 cm and stored at 23° C. for 1 week. After the storage, the surface of the metal foil was found non-stained with the thermosetting polyphenylene ether resin. The polyethylene film could be easily peeled off by rubbing the edge with a finger.

EXAMPLE 15

A multilayered wiring board comprising 6 wiring layers was prepared using a thermosetting polyphenylene ether resin having a heat resistance of 200° C. as an insulating resin. The heat resistance of the multilayered wiring board was 200° C. The speed of electrical signal transmission of the multilayered wiring board was found to be 17.5 cm/nsec or higher at every position as measured by TDR (time domain reflection method). On the multilayered wiring board were mounded a field programmable gate array chip, a damping resistor, and a capacitor and sealed with a resin to make an electronic device. Mounted on a digital circuit board whose standard clock was 100 MHz, the electronic device operated without any problem. When the digital circuit board was treated at 60° C. and at a relative humidity of 90% for 1000 hours, it operated again without any problem.

COMPARATIVE EXAMPLE 4

A multilayered wiring board which was prepared by using a general epoxy resin for a copper-clad laminate as an insulating resin was used in place of the multilayered wiring board of Example 15. It was revealed that the speed of electrical signal transmission as measured by TDR was 15.0 cm/nsec at the highest. An electronic device was produced by using the same elements as in Example 15. When subjected to a performance test at a standard clock of 100 MHz, the electronic device did not operate normally. It operated at a standard clock reduced to 70 MHz. When the digital circuit board was treated at 60° C. and at a relative humidity of 90% for 1000 hours, it did not operated normally any more.

Industrial Applicability

The thermosetting resin-having metal foil for a multilayered wiring board according to the present invention makes it practicable to produce a high-performance multilayered wiring board exhibiting a stable characteristic impedance by a lamination build up process. The production process according to the present invention provides polyphenylene ether resin-having metal foil having excellent quality. To the resin-having metal foil according to the present invention can be adhered by pressing an inexpensive sheet for protecting the resin surface to provide resin-having metal foil suited for storage and handling. Since the multilayered wiring board of the present invention exhibits a stable characteristic impedance and excellent electrical characteristics, it provides high-speed digital circuits and high-frequency circuits having high performance not heretofore attained. The electronic device according to the present invention exhibits excellent performance not heretofore attained in high-speed operation and high-frequency operation.

What is claimed is:

1. A sequentially multilayered wiring board which comprises wiring layers comprising sequentially laminated sheets of resin-having metal foil, wherein the resin-having metal foil comprises metal foil having provided on one side thereof a film of a thermosetting resin having a relative dielectric constant of not higher than 3.3 at a frequency range of not lower than 1 MHz and having a resin flow ratio of 1 to 50% by weight.

2. The sequentially multilayered wiring board according to claim 1 wherein the resin flow ratio is 5 to 50% by weight.

3. The sequentially multilayered wiring board according to claim 1 or 2, wherein said thermosetting resin contains an inorganic filler.

4. The sequentially multilayered wiring board according to claim 1 or 2, wherein said thermosetting resin has a glass transition temperature of not lower than 180° C. after it cures.

5. The sequentially multilayered wiring board according to claim 1 or 2, wherein said thermosetting resin is a thermosetting polyphenylene ether resin.

6. The sequentially multilayered wiring board according to claim 5, wherein said thermosetting resin is a thermosetting polyphenylene ether resin containing a styrene polymer.

7. A process for producing resin-having metal foil for the sequentially multilayered wiring board according to claim 5, which comprises coating metal foil with a resin varnish comprising a thermosetting polyphenylene ether resin and a solvent and drying the coating film, wherein the drying is carried out under such a condition that the rate of evaporation of the solvent be not higher than 0.10 g/cm$^2$·min.

8. A process for producing resin-having metal foil for the sequentially multilayered wiring board according to claim 5, which comprises coating metal foil with a resin varnish comprising a thermosetting polyphenylene ether resin and a solvent and drying the coating film, wherein the drying is carried out under such a condition that the rate of evaporation of the solvent be not higher than 0.10 g/cm$^2$ min until the residual solvent concentration of the coating film is reduced to 200,000 ppm.

9. A process for producing resin-having metal foil for the sequentially multilayered wiring board according to claim 5, which comprises melt-extruding a thermosetting polyphenylene ether resin under a condition that does not substantially cause the resin to decompose.

10. The sequentially multilayered wiring board according to claim 1 or 2, wherein the resin-having metal foil has an easily strippable sheet for protecting said resin surface.

11. An electronic device comprising a sequentially multilayered wiring board according to claim 1 or 2 and an electronic element connected thereto with a wiring means.

12. The electronic device according to claim 11, comprising a sequentially multilayered wiring board according to claim 1 or 2 which achieves a speed of electrical signal transmission of 16.5 cm/nsec or higher and has a heat resistance of not lower than 180° C. and an electronic element.

13. A process for producing a sequentially multilayered wiring board, which comprises a step of forming a wiring board by sequentially laminating a resin-having metal foil which comprises metal foil having provided on one side thereof a film of a thermosetting resin having a relative dielectric constant of not higher than 3.3 at a frequency range of not lower than 1 MHz and having a resin flow ratio of 1 to 50% by weight.

14. The process for producing a sequentially multilayered wiring board according to claim 13, wherein the resin flow ratio is 5 to 50% by weight.

15. The process for producing a sequentially multilayered wiring board according to claim 13 or 14, wherein said thermosetting resin contains an inorganic filler.

16. The process for producing a sequentially multilayered wiring board according to claim 13 or 14, wherein said thermosetting resin has a glass transition temperature of not lower than 180° C. after it cures.

17. The process for producing a sequentially multilayered wiring board according to claim 13 or 14, wherein said thermosetting resin is a thermosetting polyphenylene ether resin.

18. The process for producing a sequentially multilayered wiring board according to claim 17, wherein said thermosetting resin is a thermosetting polyphenylene ether resin containing a styrene polymer.

19. The process for producing a sequentially multilayered wiring board according to claim 17, which further comprises a step of forming the resin- having metal foil by coating metal foil with a resin varnish comprising a thermosetting polyphenylene ether resin and a solvent and drying the coating film, wherein the drying is carried out under such a condition that the rate of evaporation of the solvent be not higher than 0.10 g/cm$^2$·min.

20. The process for producing a sequentially multilayered wiring board according to claim 17, which further comprises a step of forming the resin- having metal foil by coating metal foil with a resin varnish comprising a thermosetting polyphenylene ether resin and a solvent and drying the coating film, wherein the drying is carried out under such a condition that the rate of evaporation of the solvent be not higher than 0.10 g/cm$^2$·min until the residual solvent concentration of the coating film is reduced to 200,000 ppm.

21. The process for producing a sequentially multilayered wiring board according to claim 17, which further comprises a step of forming the resin-having metal foil by melt-extruding a thermosetting polyphenylene ether resin under a condition that does not substantially cause the resin to decompose.

22. The process for producing resin-having metal foil for a sequentially multilayered wiring board according to claim 13 or 14, wherein the resin-having metal foil has an easily strippable sheet for protecting said resin surface.

* * * * *